United States Patent
Ju et al.

(10) Patent No.: US 6,727,109 B2
(45) Date of Patent: Apr. 27, 2004

(54) METHOD OF FABRICATING LONG WAVELENGTH VERTICAL-CAVITY SURFACE-EMITTING LASERS

(75) Inventors: Young Gu Ju, Daejon-Shi (KR); Won Seok Han, Daejon-Shi (KR); O Kyun Kwon, Daejon-Shi (KR); Jae Heon Shin, Daejon-Shi (KR); Byueng Su Yoo, Daejon-Shi (KR); Jung Rae Ro, Daejon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

(21) Appl. No.: 10/210,668

(22) Filed: Jul. 31, 2002

(65) Prior Publication Data

US 2003/0134448 A1 Jul. 17, 2003

(30) Foreign Application Priority Data

Jan. 16, 2002 (KR) ....................................... 2002-002494

(51) Int. Cl.$^7$ ............................................. H01L 21/00
(52) U.S. Cl. ........................... 438/22; 438/24; 438/36; 438/37; 438/46; 438/47; 257/79; 257/80; 257/82; 257/89; 257/93; 257/98; 257/103
(58) Field of Search ................ 257/79, 80, 82, 257/89, 93, 98, 103; 438/22, 24, 36, 37, 46, 47

(56) References Cited

U.S. PATENT DOCUMENTS

| | | | |
|---|---|---|---|
| 5,115,442 A | | 5/1992 | Lee et al. |
| 5,212,701 A | * | 5/1993 | Choquette et al. ............. 372/45 |
| 5,568,499 A | * | 10/1996 | Lear ............................. 372/45 |
| 5,596,595 A | * | 1/1997 | Tan et al. ..................... 372/96 |
| 6,037,603 A | * | 3/2000 | Nelson ......................... 257/14 |
| 6,046,065 A | * | 4/2000 | Goldstein et al. ............. 438/46 |

* cited by examiner

Primary Examiner—Long Pham
Assistant Examiner—Wai-Sing Louie
(74) Attorney, Agent, or Firm—Blakely, Sokoloff, Taylor & Zafman

(57) ABSTRACT

The present invention relates to a method of fabricating vertical-cavity surface emitting lasers being watched as a light source for long wavelength communication. The present invention includes forming a layer having a high resistance near the surface by implanting heavy ions such as silicon (Si), so that the minimum current injection diameter is made very smaller unlike implantation of a proton. Further, the present invention includes regrowing crystal so that current can flow the epi surface in parallel to significantly reduce the resistance up to the current injection part formed by silicon (Si) ions. Therefore, the present invention can not only effectively reduce the current injection diameter but also significantly reduce the resistance of a device to reduce generation of a heat. Further, the present invention can further improve dispersion of a heat using InP upon regrowth and thus improve the entire performance of the device.

7 Claims, 3 Drawing Sheets

METHOD OF FABRICATING LONG WAVELENGTH VERTICAL-CAVITY SURFACE-EMITTING LASERS

BACKGROUND OF THE INVENTION

1. Field of the Invention

The invention relates generally to vertical-cavity surface emitting lasers being viewed as a light source for use in long wavelength communication, and more particularly to, a method of fabricating long wavelength vertical-cavity surface emitting lasers capable of making the current injection diameter very small and reducing the resistance, through implantation of heavy ions such as silicon (Si) and regrowth of crystals.

2. Description of the Prior Art

Vertical-cavity surface emitting lasers that is grown on an InP substrate as InAlGaAs/InAlAs/InGaAs series is further suited for mass production compared to edge emitting lasers in view of its geometric structure and is thus low in product cost. Therefore, the vertical-cavity surface-emitting laser will be used a lot in the future as a device for a LAN communication network. Especially, the communication distance of vertical-cavity surface emitting lasers having the wavelength of 1.3~1.55 μm can be extended to several kilometers while that of a 850 nm laser can be extended to several hundred meters. Thus, the vertical-cavity surface emitting lasers are being watched as a light source for a long wavelength communication in a next-generation optical communication network.

There has recently been proposed a structure on which InGaInAs/InAlAs as a material for a long wavelength vertical-cavity surface emitting lasers is grown on an InP substrates[J. Boucart et. al, "Metamorphic DBR and Tunnel-Junction Injection: A CW RT Monolithic Long-Wavelength VCSEL", IEEE Journal of Selected Topics I+n Quantum Electronics", Vol. 5, No. 3. p520–529 (1999)].

A current confinement structure being one of the most important factors in fabricating the vertical-cavity surface emitting lasers serves to supply charge carriers to an active region of a given area to control the laser gain area and to thus occur a laser oscillation in the area. For this, conventional vertical surface emitting lasers employ an etched pillar, ion implantation, oxidization, an air gap technique, and the like. However, most of them are based on an AlGaAs material. Thus, there is a difficulty that those techniques are applied to the InAlGaAs/InAlAs long wavelength surface emitting lasers intact.

As the laser pillar can be easily fabricated using a dry ion etching, it is used to manufacture long wavelength vertical-cavity surface emitting lasers. [J. K. Kim, E. Hall, O. Sjolund, G. Almuneau and L. A. Coldren, "Room-temperature, electrically-pumped multiple-active-region VCSELs with high differential efficiency at 1.55 μm", Vo.35, No. 13, p1084–1085 (1999)]. As the diameter of the pillar is reduced, however, the threshold current is reduced but the resistance is increased in proportion to the square of the diameter. Thus, the entire characteristic of the device is degraded. In addition, as it is etched through the active region, surface recombination is caused on the surface to loss current and to reduce the laser efficiency.

There is a characteristic that the ion dispersion radius is extended in portion to the thickness of a top reflector and a photoresist mask in a proton ion implantation method. Dispersed ions act as a resistance or cause to generate an unstable current injection characteristic. The size of the ion implantation diameter is limited by the thickness of a top reflector. In case of the long wavelength surface emitting lasers, if an InAlAs/InAlGaAs distributed Bragg reflector in the long wavelength laser is used, the size will be 6~7 μm. It is therefore considered that the minimum diameter that can be possible by ion implantation reaches to 15 μm, considering the thickness of the photoresist. As the thickness of the top reflector is increased along with increase of the wavelength compared to the short wavelength laser, the minimum current injection diameter that can be formed by a proton ion implantation method is limited.

Meanwhile, the oxidization method can form a very efficient current confinement structure. This method, however, could not grow an AlAs layer on the InP substrate in the long wavelength. Therefore, this method is difficult to be realized and its oxidization speed is very low and unstable compared to AlAs even though InAlAs is used.

Finally, the air gap method employs a selective chemical etch property between the AlAs layer and GaAs. This method includes locating the AlAs layer right on the active region and removing it using an HCl solution except for a small diameter. This method also shows a similar characteristic to the oxidization method. In this method, however, AlAs layer is not grown on the InP substrate. Similarly, there is a method by which InP is included within an epitaxial layer and the InP layer is selectively etched. Since InAlGaAs/InAlAs includes Al, it is easily oxidized and attacked by unintentional etchant. Therefore, it is not easy to find a selective etching solution capable of etching InP with a relatively small thickness and a long distance in a horizontal direction.

SUMMARY OF THE INVENTION

The present invention contributes to solving the above problems and an object of the present invention is therefore to provide the method of fabricating long wavelength vertical-cavity surface emitting lasers capable of making the current injection diameter very small, through implantation of heavy ions and regrowth of crystal.

In order to accomplish the above goal, a method of fabricating long wavelength vertical-cavity surface emitting lasers according to the present invention, comprises the steps of sequentially growing a bottom distributed Bragg reflector, a laser active region and a heat spreading layer; forming a photoresist mask on the heat spreading layer to define a region for current confinement layer; forming the current confinement layer at a surface portion of the heat spreading layer by ion implantation using the photoresist mask; removing the photoresist mask and sequentially forming an InP layer and a current spreading layer; forming an electrode on the current spreading layer and then stacking a top distributed Bragg reflector; and forming an Au reflector on the surface of the top distributed Bragg reflector.

The ions are silicon (Si) and the ions are implanted with the energy of 50~500 KeV.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Technical tasks in the current confinement structure can be summarized as follows. First, it must be applied to a long wavelength vertical-cavity surface emitting lasers of 1.3~1.55 μm composed of InAlGaAs, InAlAs and InP. Second, the contact area of the entire electrodes and the cross-section of current path are maintained to be larger than the current confinement area and there is thus no any problem that the resistance increases rapidly as the current injection diameter is reduced as in an existing pillar structure (or air-post structure). Further, it is required that a low threshold current be implemented which is an advantage of vertical-cavity surface emitting lasers since current injection can be allowed to a diameter of less than 10 μm. Finally, it is required that the manufacturing process is simple and stable and it can be applied to mass-production. The present invention proposes a current confinement structure of a long wavelength vertical-cavity surface emitting lasers that can satisfy the above conditions.

Next, the long wavelength vertical-cavity surface emitting lasers has a characteristic that its performance is abruptly degraded along with increased temperature due to a small band gap of a material itself. In order to solve this problem, there is a need for an efficient heat spreading structure. The present invention proposes a heat spreading structure that can coexist with the current confinement structure.

Figure 1:
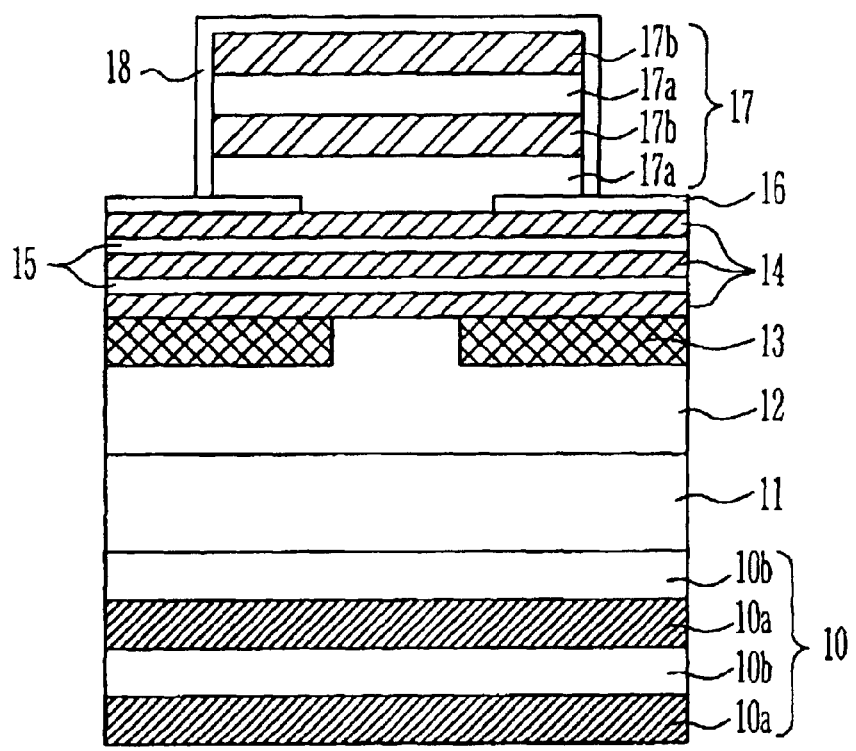
FIG. 1~FIG. 3 are cross-sectional views of long wavelength vertical-cavity surface emitting laser devices for describing the devices according to the present invention.

As shown in FIG. 1, the current confinement structure of the present invention mainly includes an InP layer 12 into which an impurity of a p type is doped, a current confinement layer 13 formed in the InP layer 12 and into which silicon (Si) ions are implanted, and an InP layer 14 regrown on the InP layer 12 including the current confinement layer 13. The bottom distributed Bragg reflector 10 and the top distributed Bragg reflector 17 have high refractive index and low refractive index, respectively. The numbers of repeated layers are 40~50 pairs, 5~6 pairs, respectively. But, the number can changed depending on required refractive index.

Figure 2:
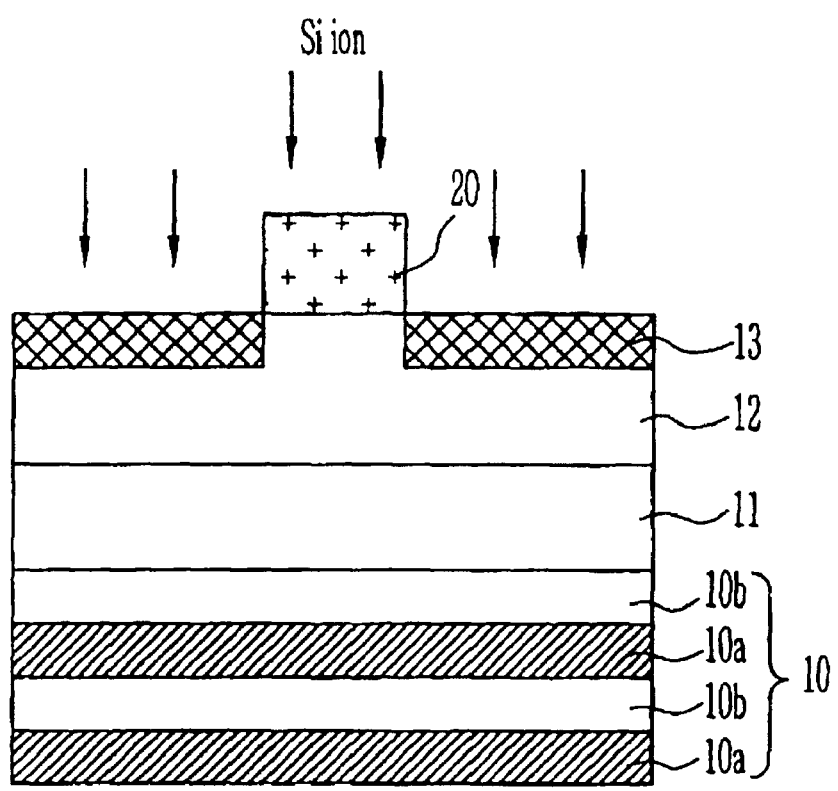

First, a bottom distributed Bragg reflector 10, a laser active region 11 and a heat spreading layer 12 are grown according to the thickness of a resonator using a crystal growth equipment. As shown in FIG. 2, a photoresist mask 20 is formed on the heat-spreading layer 12. Next, heavy ions such as silicon (Si) are implanted by means of an accelerator to form the current confinement layer 13. In case that silicon (Si) ions are implanted by the energy of 50~500 KeV, preferably 120 KeV, distribution of ions around the depth of 1300 Å is maximized and crystal state is disrupted up to the depth of 3000 Å from the surface, thus forming an insulating film 13. Portions covering photoresist mask 20 maintain its conductive state since they are not attacked by ions.

Figure 3:
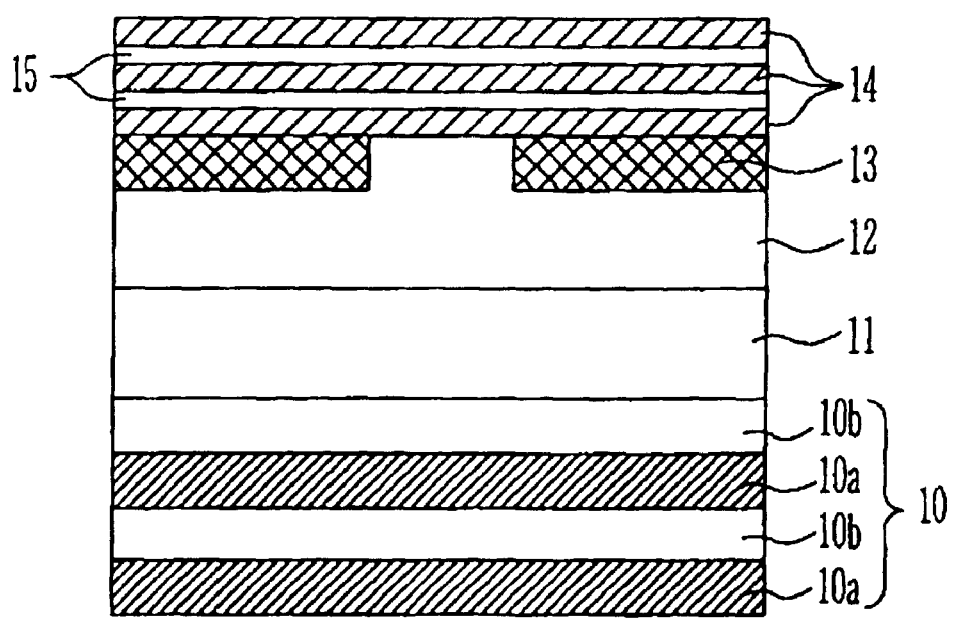

The photoresist mask 20 is then removed. Next, as shown in FIG. 3, an InP layer 14 and an InAlGaAs current spreading layer 15 are sequentially regrown on the InP heat spreading layer 12 including the current confinement layer 13 at the temperature of 450~600° C.

Then, a conductive layer is formed on the InAlGaAs current spreading layer 15 and is then patterned to form an electrode 16. Next, an top distributed Bragg reflector 17 is stacked using a dielectric thin film or a dielectric thin film and a metal, as shown in FIG. 1. An Au reflector 18 is then formed on the surface of the top distributed Bragg reflector 17. At this time, the Au reflector 18 on the top layer surrounding the top distributed Bragg reflector 17 serves to increase the reflectivity of the dielectric mirror.

At this time, as the regrown InP layer 14 is doped with a p type impurity, it serves not only to conduct current from the electrode to the current confinement part but also to disperse the heat generated in the center of the device using a high thermal conductivity of InP like a lower InP layer 12. As the electrode is formed of a metal and has high thermal conductivity, it serves to spread heat in lateral direction, which is then cooled by air or transferred to the thermo-electric cooler. The heat removal efficiency is better when the cross-section of heat path is greater. This is why the InP layer used here is called as the heat-spreading layer 12. Meanwhile, the current spreading layer 15 is a layer through which current conducts well since it is doped with a p type impurity. The current spreading layer 15 also serves to transfer current injected from the electrode 16 to the central portion of a laser output mirror without great increase of the resistance. As the current spreading layer 15 is located at a node at which the intensity of light is minimized when the resonator is fabricated, it does rarely increase adsorption loss of the resonator.

As mentioned above, the present invention solves problems related to a current confinement method and heat emission that are most important in developing long wavelength vertical-cavity surface emitting lasers.

First, in the past, a high-energy proton ion implantation method that was used when 850 nm vertical-cavity surface emitting lasers is fabricated could not be applied to an InAlGaAs-based long wavelength laser. In the present invention, however, heavy ions such as silicon (Si) are implanted to form an insulating film having a sufficient high resistance even at a long wavelength material. This method allows a much smaller current injection diameter since the depth of ion implantation is shallow. As for existing proton implantation vertical-cavity surface-emitting laser, the thick top distributed Bragg reflector also increases a proton implantation depth. Therefore, there was a limit to reduce the current injection diameter since ions straggle as they penetrate into top distributed Bragg reflector. However, in the structure of the present invention, the lateral deviation of ion distribution is significantly reduced since the current confinement layer formed by peak of Si implantation distribution is very near to the surface. As a result, the current injection diameter can be smaller further.

Secondly, the regrown portions in the present invention causes to reduce the resistance when current flows into the surface using a current spreading layer. Thus, the present invention can significantly reduce the resistance up to the current injection part formed by implantation of ions in the electrode. This improved electrical characteristic decreases heat generation in the device to significantly contribute to a long wavelength laser operation and to thus improve a high-speed modulation characteristic.

Thirdly, the present structure can improve the cooling effect since an InP layer on top of laser active region and a regrown InP layer have a high thermal conductivity. The generated heat at the center of the device can be thus well transferred to the electrode.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of fabricating long wavelength vertical-cavity surface emitting lasers, comprising the steps of:

sequentially growing a bottom distributed Bragg reflector, a laser active region and a heat spreading layer;

forming a photoresist mask on said heat spreading layer to define a region for current confinement layer;

forming the current confinement layer at a surface portion of the heat spreading layer by ion implantation using the photoresist mask;

removing said photoresist mask and sequentially forming an InP layer and a current spreading layer on said heat spreading layer and said current confinement layer;

forming an electrode on said current spreading layer and then stacking a top distributed Bragg reflector; and forming a metal reflector on the surface of said top distributed Bragg reflector.

2. The method as claimed in claim 1, wherein said heat spreading layer is made of InP.

3. The method as claimed in claim 1, wherein said ions are silicon (Si).

4. The method as claimed in claim 1, wherein said ions are implanted with the energy of 50~500 KeV.

5. The method as claimed in claim 1, wherein said current spreading layer is made of InAlGaAs.

6. The method as claimed in claim 1, wherein said top distributed Bragg reflector is made of a thin dielectric film or is made of a thin dielectric film and a metal.

7. The method as claimed in claim 1, wherein said InP layer and said current spreading layer are grown at the temperature of 450~600° C.

* * * * *